METHOD OF MAKING MINIATURE HYBRID INTEGRATED CIRCUITS

Original Filed Sept. 1, 1966 2 Sheets-Sheet 1

INVENTOR
Britton T. Vincent
Charles E. Earhart
BY Kenneth R. Glaser
ATTORNEY

United States Patent Office 3,626,584

Patented Dec. 14, 1971

3,626,584

METHOD OF MAKING MINIATURE HYBRID INTEGRATED CIRCUITS

Britton T. Vincent, Jr., Dallas, and Charles E. Earhart, Plano, Tex., assignors to Texas Instruments Incorporated, Dallas, Tex.

Continuation of application Ser. No. 576,571, Sept. 1, 1966. This application July 25, 1969, Ser. No. 847,803

Int. Cl. B01j *17/00;* H01l *1/16*

U.S. Cl. 29—577 5 Claims

ABSTRACT OF THE DISCLOSURE

In the disclosed method a miniature hybrid integrated circuit is fabricated by selectively removing portions of the glaze from a ceramic substrate to expose portions of the substrate surface. Circuit components are disposed in thermal contact with the exposed portions and may be interconnected with passive circuit elements supported on the glaze.

This application is a continuation of application Ser. No. 576,571, filed Sept. 1, 1966, now abandoned.

This invention relates to integrated circuits, and more particularly to a method of making upon a ceramic substrate miniature hybrid integrated circuits of the type having a combination of active chip elements and thin film passive components.

There is a substantial use for thin film hybrid integrated circuits in applications where passive components with the desired parameters cannot be formed in a monolithic integrated circuit. In avoiding the limitations of monolithic integrated circuits, one approach has been to combine active chip components (which in themselves may be monolithic integrated circuits) and passive components formed by the thin film itself. The active chip elements are bonded to the film to form a complete circuit. As used in this application, a hybrid circuit includes, but is not limited to, a circuit in which the active and passive components, including connectons therebetween, are formed in or upon a ceramic substrate.

Standard thin film technology requires a very smooth substrate surface to support the very thin metallic film. Such a metallic film may have a thickness in the range of about 3,000 A. to about 10,000 A. Because of this requirement of substrate smoothness to support the film, the relatively rough surface of a ceramic substrate cannot be used. In other respects the choice of ceramic materials, such as aluminum oxide as the substrate material, is an excellent one due to their high thermal conductivity. However, to permit the use of an aluminum oxide ceramic as the substrate so that its high thermal conductivity can be utilized, it has been found that the surface of the ceramic must be coated with a thin layer of approximately 2 to 3 millinches of glass which provides the required smoothness of surface necessary for subsequent thin film deposition. The glass, or glaze as it is sometimes called, is usually of a borosilicate type having a thermal expansion coefficient matching that of the underlying aluminum oxide. Such glazed ceramics can be obtained from any number of ceramic companies such as American Lava, Chattanooga, Tennessee, and Coors Porcelain, Golden, Colorado.

A disadvantage of the glaze, however, is that it does not have the high thermal conductivity of the underlying ceramic. For example, a standard borosilicate glass has a thermal conductivity of .002 cal. cm./sec. cm.$^2$° C. at 100° C. whereas the thermal conductivity of aluminum oxide is typically .08 cal. cm./sec. cm.$^2$° C. at 100° C. From a comparison of the relative thermal conductivities, it is evident that the glaze layer inhibits the heat dissipation capacity of the aluminium oxide ceramic substrate. To realize the heat dissipation capacity of the aluminum oxide itself in areas adjacent the active components of a hybrid integrated circuit, but yet retain the smooth surface of the covering glaze on which the passive thin film components and interconnections are to be formed, the glaze should be selectively removed in areas to be subsequently used for bonding the active chip components to the substrate. Such methods of removing the glaze as cavitron techniques or air abrasive action, however, have not proved satisfactory. Instead, the standard KMER photoresist mask and etch technique, used with success in the semiconductor industry to remove very thin thicknesses of material, has been used with only limited success for removal of the desired glazed areas. Because of the relatively greater thickness of the glaze, from 1 to 3 millinches as compared to the thickness of material measured in angstrom units usually removed by the KMER photoresist technique, the edges of the photoresist material loosen and pull away before the etch has penetrated to the desired depth, thus destroying the desired definition of the areas where the glaze is to be removed.

With these difficulties in mind, it is an object of this invention to provide an improved method of selectively etching away the glaze on a ceramic substrate in areas where the active elements of a hybrid integrated circuit are to be placed upon and bonded to the ceramic substrate.

It is further object of the invention to provide a method whereby a thin metallic film acts as a mask for selectively etching away the glaze in desired areas.

In accordance with these and other objects, features and improvements, the invention involves an improved method of selectively etching the glaze in deired areas on a ceramic substrate, such as aluminum oxide. Accordingly, the glazed ceramic is first covered with a thin film of metal, deposited on the ceramic by any suitable technique, which is both electrically conductive and adherent to glass, for example molybdenum; or if gold is preferred as the electrically conductive metal film, particularly in high frequency circuits where the resistance of the interconnections is a factor, then a "dual" film of gold and another metal, chromium for example, is used, the chromium being adherent both to the glass and to the gold. The metallic film is then covered with a mask having apertures therein which expose portions of the film to be removed, and subjected to a metallic etch condition for a period of time sufficient to remove the portions of the metallic film defined by the apertures in the mask. The mask is then removed and the remainder of the metallic thin film is itself used a mask for etching down to the ceramic substrate in those exposed areas which are to be used as bonding areas for transistors and other active chip elements.

After the exposed areas of the glaze have been removed, substantially all of the metallic film is removed except in those areas where the film is to be used for capacitor bottom plates. The face of the aluminum oxide substrate (including the unetched portions of the thin film) is completely covered with a dielectric material such as silicon oxide. By using suitable masking techniques, the dielectric material is then removed except where it is formed over the capacitor bottom plates. The aluminum oxide substrate is then subjected to a second metal deposition whereby the face of the substrate (including the unetched portions of the dielectric material) is completely covered with a second thin metallic film. This film is covered with a suitable masking material and subjected to an etch condition for a sufficient period of time to form the capacitor top plates, resistors, inductors, bonding areas for active components, and all required interconnections of the components of the thin film hybrid integrated circuit. As a final step, the active chip components (such as transistors) are bonded to the metallized substrate using a metal preform in those areas where the glaze has been removed. Wire connections between the base and emitter regions of the transistors and the rest of the circuit are then applied. The thin film device is now ready for lead attachment and encapsulation.

The novel features believed to be characteristic of the invention are set forth with particularity in the appended claims. The invention itself, however, as well as further objects and advantages thereof, may best be understood by reference to the following detailed description of an illustrative embodiment, when read in conjunction with the appended claims and the accompanying drawings, wherein:

Figure 1:
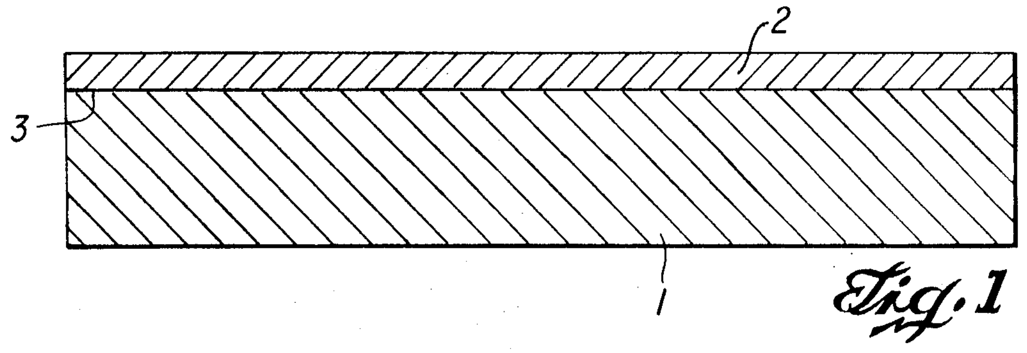
FIG. 1 is a sectional view of the glazed substrate.

Referring now to the drawings, FIG. 1 shows the starting material used in the method of the invention. A ceramic substrate 1, for example aluminum oxide of approximately .020 inch in thickness has a glass or glazed layer 2 of approximately .003 inch in thickness applied to one face 3 of the substrate by any suitable means, or the composite of substrate and glaze may be purchased commercially as previously indicated. The glass layer 2 should have compatible thermal expansion characteristics with the underlying substrate 1. For this reason borosilicate glass compositions are usually used in conjunction with aluminum oxide ceramics. The surface of the glass must be very smooth and free of voids and open bubbles to allow depositions of defect-free thin films.

Figure 2:
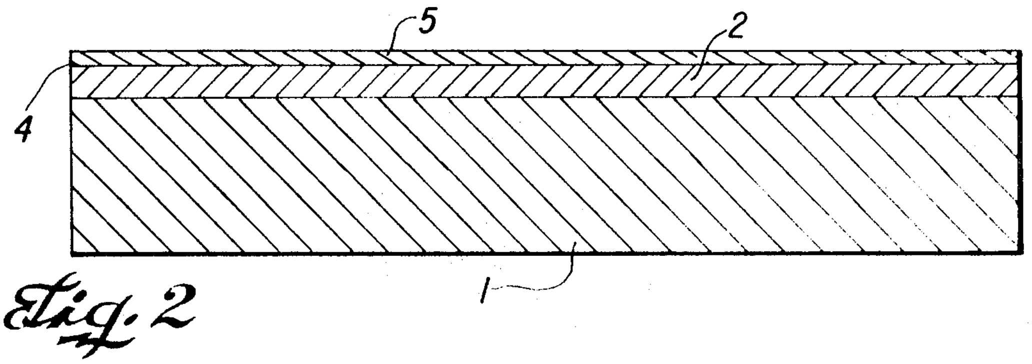
FIG. 2 is a sectional view of the glazed substrate following the deposition of the first metallic thin film.

The first layer of metal, such as molybdenum, to form the metallic thin film 5 is deposited upon the entire face 4 of the glazed layer 2, as illustrated in FIG. 2. As previously indicated, the film 5 can be a "dual" film of gold and chromium, for example, with a film of chromium on the face of the glaze and a film of gold over the film of chromium. The metallic layer can be deposited by standard evaporation or reactive sputtering techniques, both in common use in the electronics industry. The deposition is continued until a metal layer of approximately 3000 A. is built up.

Figure 3:
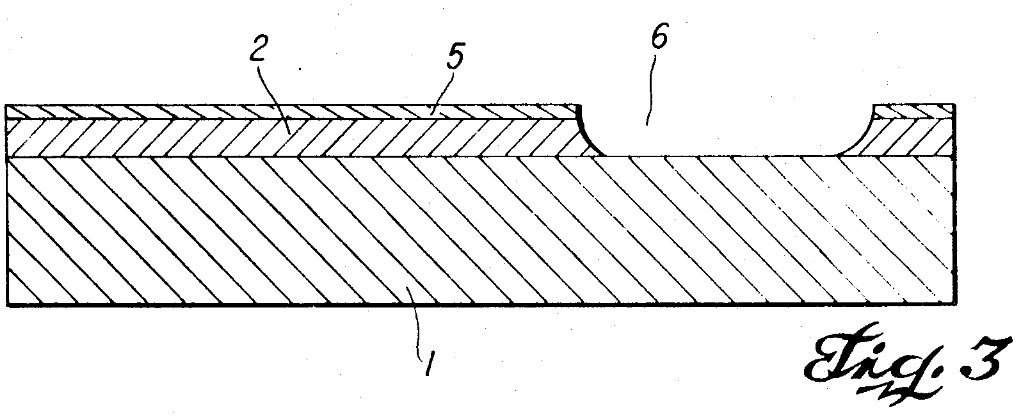
FIG. 3 is a sectional view of the glazed substrate following removal of a designated area of the glaze and metallic thin film.

As previously described, a suitable mask (not shown) is applied on the surface of thin film 5 by the use of standard photoresist and etch techniques such that desired areas of the film are exposed. The mask and the exposed areas are then subjected to an etching condition for a period of time sufficient to remove selected portions of the thin film 5. The remainder of the film acts as a very adherent mask while the cavity 6 in the glaze 2, as illustrated in FIG. 3, is removed by etching with an etch material, such as hydrofluoric acid, which attacks the glass but leaves the thin metallic film 5 intact.

Figure 4:
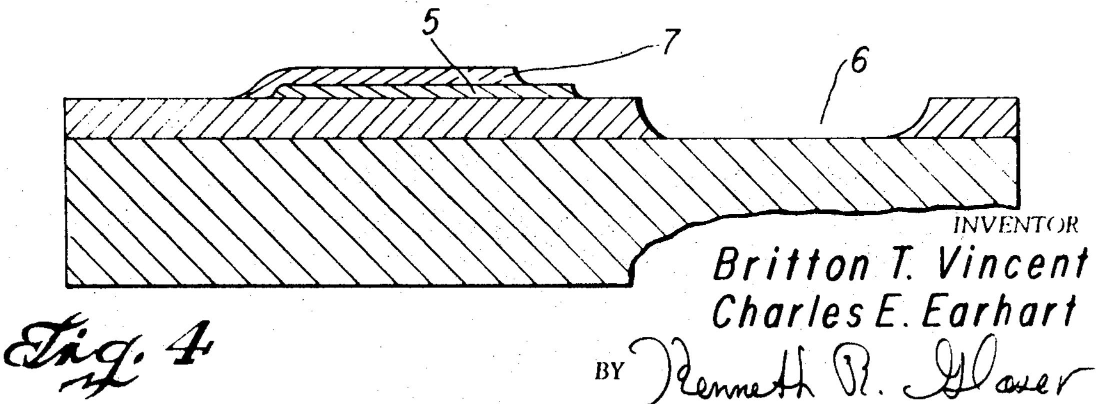
FIG. 4 is a sectional view of the glazed substrate following deposition and etch of the dielectric material.

The surface of thin film 5 is then covered with a mask (not shown) composed of photoresist material, and subjected to an etching condition for a period of time sufficient to remove all of the remaining film 5 except in those areas of the film which are necessary as the bottom plates for subsequently formed capacitors, as illustrated in FIG. 4. In said FIG. 4, only the step of forming one capacitor is illustrated.

The dielectric material 7 is then formed to a thickness of approximately 5,000 A. over the entire upper surface of the glazed substrate, including the cavity 6 and bottom capacitor plate 5 by any suitable deposition technique, such as sputtering in a vacuum. A KMER photoresist mask is formed which exposes selected portions of the dielectric material 7. The mask and the selected portions of the dielectric material 7 are subjected to an etching condition for a period of time sufficient to remove all of the dielectric material 7 except that which lies on top of the remaining portions of the film 5 as illustrated in FIG. 4.

Figures 5, 6, 7:
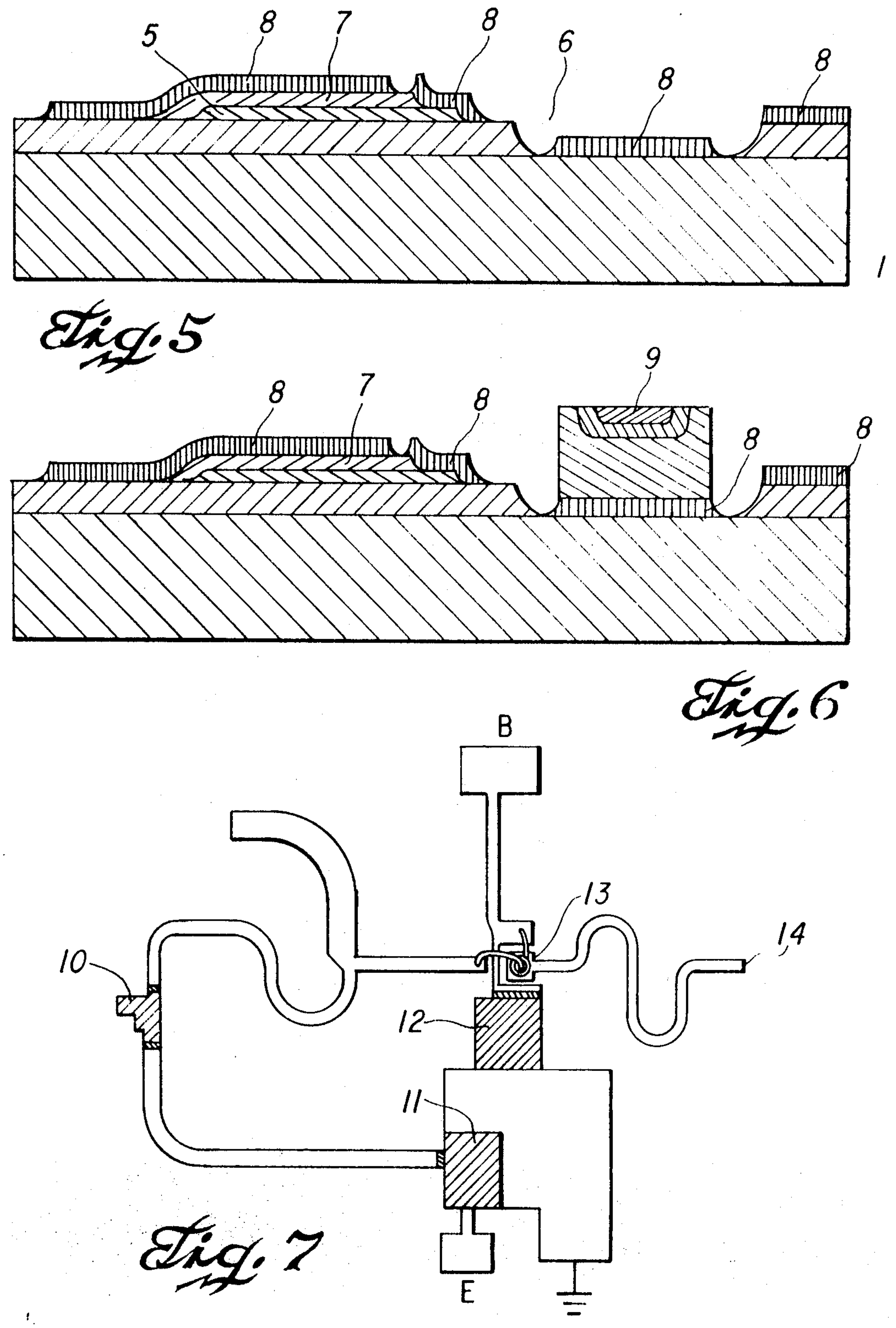
FIG. 5 is a sectional view of the glazed substrate following the removal of the excess second metallic thin film.
FIG. 6 is a sectional view of the glazed substrate prior to the final fabrication steps of lead attachment and encapsulation.
FIG. 7 is a plan view of a typical microwave integrated circuit using the etch technique of the invention.

As illustrated in FIG. 5, to form the top capacitor plate, interconnections between passive components (including resistors and inductors where necessary), and the bonding area for the active components, a second metallic thin film 8 similar to the metallic thin film 5 is deposited by an evaporating or sputtering technique upon the entire upper surface of the glazed substrate (film 8 is shown after the subsequent etch) including the cavity and dielectric material 7. The metallic film 8 is then covered with a suitable mask of photoresist material, and the mask and the portions of the film 8 exposed by the mask are subjected to an etching condition for a period of time sufficient to remove all of the film 8 except in the areas needed for the top plate of each capacitor, interconnections between the components, and the portion of the substrate in the etched cavity 6 to be used for bonding an active chip component to the substrate 1.

In FIG. 6 is illustrated the position of the active chip component 9 bonded to the portion of the thin metallic film 8 in the etched cavity 6, thereby assuring a good thermal path from the active chip component 9, such as a transistor or diode, to the aluminum oxide substrate 1 which acts as a heat sink. The active chip component 9 is bonded to the thin film 8 in the cavity 6 by the use of a gold or similar type preform with the application of heat. The final steps of connecting the emitter and base regions of the transistor 9 to the rest of the circuit, attaching the necessary leads, and encapsulating the entire device are not shown as they are well known in the transistor art.

In FIG. 7 is shown the top of a typical thin film hybrid integrated circuit for microwave application, produced according to the invention. The shaded areas 10, 11 and 12 represent thin film capacitors with the capacitor 10 furnishing a capacitive input to the circuit. The transistor 13 is located on the etched glaze area formed as previously described. The output of the circuit is at the connection point 14, the base of the transistor is indicated by the character B and the emitter by the character E.

While the method of the invention has been described with reference to a specific embodiment, it is to be understood that this description is not to be construed in a limiting sense. Various modifications of the invention will become apparent to persons skilled in the art without departing from the spirit and scope of the invention as defined by the appended claims.

What is claimed is:

1. In a method of forming a thin film hybrid integrated circuit upon a glazed ceramic substrate, the steps of:

(a) forming a metal mask upon said glazed substrate, said mask having apertures therein to expose portions of said glazed substrate, (b) etching away said portions of the glaze through the apertures in said metal mask to expose selected areas on a surface of said substrate, (c) selectively etching away portions of said metal mask, thereby leaving metal areas selectively adapted for use as elements of passive circuit components, and (d) attaching circuit components in thermal communication with said selected exposed areas, said circuit components being adapted to be electrically connected to said elements of said passive circuit components.

2. A method of forming a thin film hybrid integrated circuit upon a glazed face of a ceramic substrate, comprising the steps of:

(a) depositing a first metallic thin film upon said glazed face of said ceramic substrate, (b) removing selected portions of said first metallic thin film, thereby exposing selected portions of said glaze, (c) removing said selected portions of said glaze, said first metallic thin film defining said removed portions of said glaze, (d) removing the remainder of said first metallic thin film except for selected portions thereof as first capacitor plates, (e) depositing dielectric material upon said face of said ceramic substrate, including said selected portions of said first thin metallic film, (f) removing selected portions of said dielectric material thereby leaving said dielectric material only upon said first capacitor plates, (g) depositing a second metallic thin film upon said face of said ceramic substrate, including said dielectric material, (h) removing selected portions of said second metallic thin film except in areas where said glaze has been removed, upon said dielectric material and areas defining other passive components, (i) attaching active components upon said portion of said second metallic thin film overlying said substrate where said glaze has been removed, and (j) connecting the regions of said active components to the remainder of said second metallic thin film thereby to complete said hybrid integrated circuit.

3. In the method defined in claim 2, wherein said glaze is removed by etching.

4. In the method defined in claim 2, wherein said selected portions of said glaze are removed by etching with a hydrofluoric acid compound.

5. In the method defined in claim 1, and further including the step of forming additional passive circuit components upon said substrate and electrically connecting said additional passive circuit components selectively to said active circuit components to form said thin film hybrid integrated circuit.

References Cited

UNITED STATES PATENTS

| | | | |
|---|---|---|---|
| 3,258,898 | 7/1966 | Garibotti | 29—625 X |
| 3,326,729 | 6/1967 | Sigler | 29—577 X |
| 3,341,649 | 9/1967 | James | 29—576 S UX |

JOHN F. CAMPBELL, Primary Examiner

W. TUPMAN, Assistant Examiner

29—590, 578; 156—17